United States Patent
Zeng et al.

(10) Patent No.: US 9,872,403 B2
(45) Date of Patent: Jan. 16, 2018

(54) ELECTRICAL CABINET WALL FOR AN ELECTRICAL CABINET OF A WIND TURBINE

(71) Applicant: General Electric Company, Schenectady, NY (US)

(72) Inventors: Winston Lei Zeng, Raleigh, NC (US); Thomas Robert Donnelly, Potomac, MD (US); Cornelius Edward Holliday, III, Forest, VA (US); David Scott Wilmer, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 154 days.

(21) Appl. No.: 14/842,930

(22) Filed: Sep. 2, 2015

(65) Prior Publication Data
US 2017/0064863 A1 Mar. 2, 2017

(51) Int. Cl.
*H02B 1/56* (2006.01)
*H05K 5/02* (2006.01)
*F03D 80/80* (2016.01)

(52) U.S. Cl.
CPC ........... *H05K 5/0213* (2013.01); *F03D 80/82* (2016.05); *F05B 2260/20* (2013.01); *H02B 1/565* (2013.01); *Y02E 10/72* (2013.01)

(58) Field of Classification Search
None
See application file for complete search history.

(56) References Cited

U.S. PATENT DOCUMENTS

| 7,615,884 | B2* | 11/2009 | McMaster | F03D 9/00 290/44 |
| 8,785,770 | B2* | 7/2014 | Gingrich | H02B 1/565 174/17 VA |
| 2006/0050470 | A1* | 3/2006 | Eiselt | H02B 13/025 361/605 |
| 2010/0186981 | A1* | 7/2010 | Thomas | H01R 4/36 174/50 |
| 2010/0186984 | A1* | 7/2010 | Puccini | H02B 1/32 174/59 |
| 2011/0233934 | A1* | 9/2011 | Crane | F04B 17/02 290/52 |

(Continued)

FOREIGN PATENT DOCUMENTS

CN 201533467 7/2010

*Primary Examiner* — Courtney Smith
(74) *Attorney, Agent, or Firm* — Dority & Manning, P.A.

(57) ABSTRACT

The present disclosure is directed to an electrical cabinet for an electrical assembly for a wind turbine. The electrical cabinet has one or more walls that define an internal volume having one or more electrical components configured therein. One or more of the walls includes an inner panel and an outer panel mounted to the inner panel. The inner panel includes an inner vent and the outer panel includes an outer vent. Further, the panels are arranged together so as to define a flow path between the inner and outer vents. Thus, during normal operation, air is directed from outside of the electrical cabinet to the internal volume of the electrical cabinet via the flow path so as to cool the one or more electrical components. Further, during a fault event, gas is permitted to exit the internal volume of the electrical cabinet via the flow path.

18 Claims, 10 Drawing Sheets

(56) References Cited

U.S. PATENT DOCUMENTS

2012/0286519 A1* 11/2012 Yoon ..................... F03D 11/02
290/55
2013/0026139 A1* 1/2013 Becker .................. F03D 11/00
218/157

* cited by examiner

ELECTRICAL CABINET WALL FOR AN ELECTRICAL CABINET OF A WIND TURBINE

FIELD OF THE INVENTION

The present disclosure relates generally to wind turbines, and more particularly to an improved electrical cabinet wall for an electrical cabinet of a wind turbine.

BACKGROUND OF THE INVENTION

Wind power is considered one of the cleanest, most environmentally friendly energy sources presently available, and wind turbines have gained increased attention in this regard. A modern wind turbine typically includes a tower, a generator, a gearbox, a nacelle, and a rotor having one or more rotor blades. The rotor blades transform wind energy into a mechanical rotational torque that drives one or more generators via the rotor. The generators are sometimes, but not always, rotationally coupled to the rotor through the gearbox. The gearbox steps up the inherently low rotational speed of the rotor for the generator to efficiently convert the rotational mechanical energy to electrical energy, which is fed into a utility grid via at least one electrical connection. Such configurations may also include power converters that are used to convert a frequency of generated electric power to a frequency substantially similar to a utility grid frequency. In addition, the wind turbine typically includes an electrical assembly having one or more electrical cabinets, e.g. the down-tower electrical assembly, that houses the various electrical components of the turbine.

During operation of the wind turbine, high arc flashing can occur in the electrical cabinet(s) during an inside fault event. As used herein, the terms "fault event," "grid fault," "fault," or similar are intended to cover a change in the magnitude of grid voltage for a certain time duration. For example, when a grid fault occurs, voltage in the system can decrease by a significant amount for a short duration (e.g. typically less than 500 milliseconds). In addition, faults may occur for a variety of reasons, including but not limited to a phase conductor being connected to ground (i.e. a ground fault), short circuiting between two or more phase conductors, lightning and/or wind storms, and/or a transmission line being connected to the ground by accident.

During such faults, high energy arc flashing can be experienced in the electrical cabinet(s) of the electrical assembly of the wind turbine. Thus, the arcing energy must either be contained inside of the cabinet(s) or attenuated such that low-level energy is provided at the cabinet exit so as to protect personnel working outside of the cabinet. However, such requirements can be difficult to satisfy since the cabinet(s) also needs to be air-cooled through ventilation and is required to have a certain Ingress Protection (IP) rating, i.e. no or very little water ingress.

Thus, the present disclosure is directed to an improved electrical cabinet wall for an electrical assembly of a wind turbine that addresses the aforementioned issues.

BRIEF DESCRIPTION OF THE INVENTION

Aspects and advantages of the invention will be set forth in part in the following description, or may be obvious from the description, or may be learned through practice of the invention.

One example aspect of the present disclosure is directed to an improved electrical cabinet wall for an electrical assembly for a wind turbine. A typical electrical assembly of the wind turbine, e.g. a electrical assembly, includes an electrical cabinet having one or more walls that define an internal volume. In addition, one or more electrical components configured are housed within the internal volume. Thus, at least one of the electrical cabinet walls may include an inner panel and an outer panel mounted to the inner panel. The inner panel is configured to wall at least a portion of an opening of the electrical cabinet. Further, the inner panel includes an inner vent. Similarly, the outer panel includes an outer vent. In addition, the inner and outer panels are arranged together so as to define a flow path between the inner and outer vents. Thus, during normal operation, air is directed from outside of the electrical cabinet to the internal volume of the electrical cabinet via the flow path so as to cool the one or more electrical components. Further, during a fault event, gas is permitted to exit the internal volume of the electrical cabinet via the flow path.

In one embodiment, the cabinet wall may include any wall of the cabinet, including for example a top wall, a bottom wall, a front wall or cover, a back wall, or opposing side walls. Thus, it should be understood that the cabinet wall may be fixed (i.e. mounted) and/or removable (i.e. openable).

In another embodiment, the inner panel may include a base wall and a plurality of side walls extending perpendicularly therefrom. Thus, the inner vent may be configured in the base wall. In certain embodiments, the base wall of the inner panel may further include an opening configured above the inner vent. In such embodiments, the cabinet wall may also include a gas expansion cover mounted to the base wall adjacent to the opening of the inner panel.

In another embodiment, the outer panel may include an outer wall and a plurality of side walls defining an inner cavity. More specifically, the plurality of side walls may include a top side wall, a bottom side wall, and opposing side walls. In certain embodiments, the bottom side wall may include a sloped bottom side wall.

In additional embodiments, the cabinet wall may include an inner gas shield mounted to a lower portion of the outer wall below the outer vent. More specifically, in certain embodiments, the inner gas shield may include a sloped body portion and one or more flanges. Thus, at least one flange may be mounted to the outer wall of the outer panel and an opposing flange may be mounted to the sloped bottom wall of the outer panel. Thus, when mounted, the sloped body portion of the inner gas shield may extend from an inner surface of the outer wall to the sloped bottom wall. In further embodiments, the inner gas shield may include one or more drainage holes configured to allow liquid entering the outer vent to pass therethrough.

In another embodiment, the inner vent and the outer vent may be offset so as to create an elongated flow path for the air or gas. Thus, in such embodiments, the outer vent may be above, below, or beside the inner vent. Further, the inner vent may be configured to align with one or more electrical components within the internal volume of the electrical assembly so as to provide cooling air to the one or more electrical components.

In yet another embodiment, the cabinet wall may include one or more handles configured to assist a user with removing and/or installing the cabinet wall to and from the electrical cabinet of the electrical assembly. In still further embodiments, the inner and outer panels may be constructed, at least in part, of a metal or metal alloy, the metal or metal alloy comprises at least one of copper, aluminum, steel, zinc, brass, iron, nickel, or combinations thereof.

In another aspect, the present disclosure is directed to an electrical assembly for a wind turbine. It should be understood that the electrical assembly may be a down-tower electrical assembly or may be located at any other suitable location within or near the wind turbine. Further, the electrical assembly includes at least one electrical cabinet having a plurality of walls that define an internal volume. The electrical assembly also includes one or more electrical components configured within the internal volume of the electrical cabinet. In addition, at least one of the walls of the electrical assembly may include an inner panel and an outer panel mounted to the inner panel. More specifically, the inner panel may include an inner vent and the outer panel includes an outer vent. In addition, the inner and outer panels are arranged together so as to define a flow path between the inner and outer vents. Thus, during normal operation, air is directed from outside of the electrical cabinet to the internal volume of the electrical cabinet via the flow path so as to cool the one or more electrical components. Further, during a fault event, gas is permitted to exit the internal volume of the electrical cabinet via the flow path.

In one embodiment, the electrical components as described herein may include any one or more of the following components: bus bars, cables, transformers, converters, switches, transistors, resistors, capacitors, contactors, breakers, inductors, or similar.

In yet another aspect, the present disclosure is directed to a method for mitigating arc energy in an electrical assembly of a wind turbine. As mentioned, the electrical assembly may include an electrical cabinet defining an internal volume with one or more electrical components contained therein. The method includes covering an opening of the electrical cabinet with a cabinet wall. The cabinet wall has an inner panel with an inner vent and outer panel with an outer vent. The inner and outer panels are arranged together so as to define a flow path between the inner and outer vents. During a fault event, the method also includes permitting gas to exit the internal volume of the electrical cabinet via the flow path. During normal operation, the method further includes directing cooling air from outside of the electrical cabinet to the internal volume of the electrical cabinet via the flow path so as to cool the one or more electrical components.

In one embodiment, the method may also include providing cooling air through a bottom vent in a grid cable entry section (i.e. a bottom section) of the electrical cabinet and directing the cooling air over one or more electrical components within the grid cable entry section. Further, the method may include directing the cooling air to a breaker section (i.e. a middle section) of the electrical cabinet. The method further includes recirculating the cooling air back to the bottom vent.

In one embodiment, the step of directing the cooling air to the breaker section of the electrical cabinet may further include directing cooling air through a first conduit configured with a back side of a back panel of the grid cable entry section and then directing the cooling air from the first conduit through a second conduit that connects the grid cable entry section to the breaker section.

In certain embodiments, the step of recirculating the airflow back to the bottom vent may further include recirculating the cooling air through a third conduit adjacent to the grid cable entry section and down to the bottom vent. In another embodiment, the electrical cabinet may be configured above a tower platform in a tower of the wind turbine. Thus, in particular embodiments, the method may further include recirculating the airflow through the bottom vent to an area below the tower platform.

In further embodiments, the method may also include providing an improved cabinet wall for the electrical cabinet. More specifically, the cabinet wall may include an inner panel and an outer panel mounted thereto. Thus, the inner panel is configured to cover at least a portion of an opening of the electrical cabinet. Further, the inner panel includes an inner vent and the outer panel includes an outer vent. Accordingly, in certain embodiments, the method may include circulating air and/or gas between the internal volume of the electrical cabinet and outside of the electrical cabinet through the inner and outer vents.

In additional embodiments, the outer vent may be configured above the inner vent. Thus, in such embodiments, the method may include providing cooling air through the outer vent down to the inner vent and through the electrical cabinet. Alternatively, the method may include circulating gas from the internal volume of the electrical cabinet through the inner vent up and out through the outer vent outside of the electrical cabinet.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
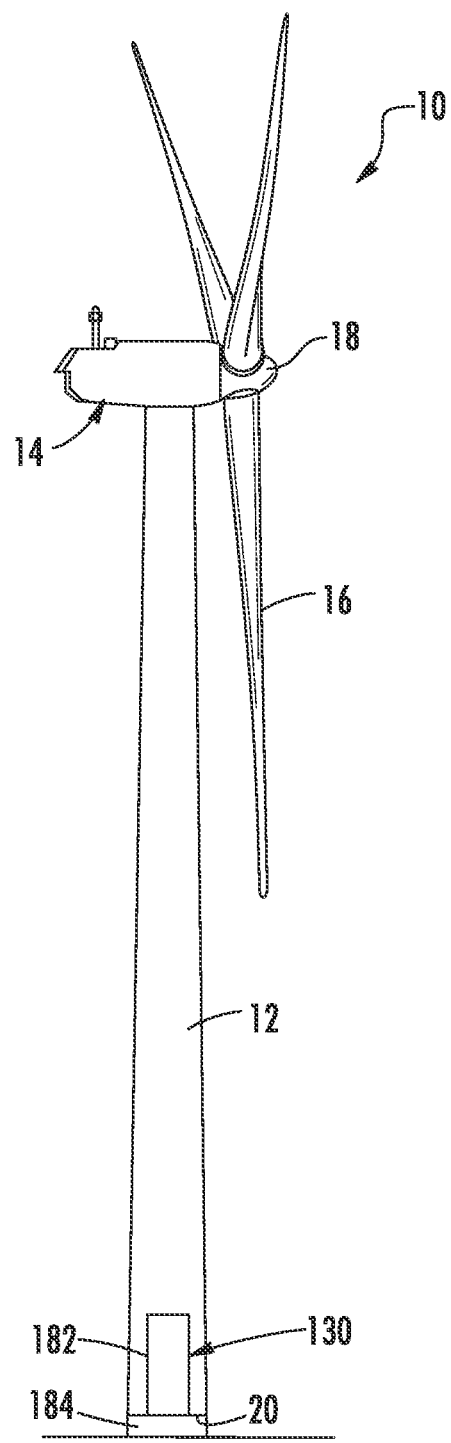
FIG. 1 illustrates a perspective view of one embodiment of a wind turbine according to the present disclosure, particularly illustrating a down-tower electrical assembly configured in the tower of the wind turbine.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to an improved electrical cabinet wall or cover for an electrical cabinet of an electrical assembly, such as down-tower electrical assembly, for a wind turbine. The electrical cabinet defines an internal volume having one or more electrical components configured therein. More specifically, the cabinet wall includes an inner panel and an outer panel mounted to the inner panel. The inner panel is configured to cover at least a portion of an opening of the electrical assembly. Further, the inner panel includes an inner vent. Similarly, the outer panel includes an outer vent. Thus, air and/or gas can be directed between the internal volume of the electrical cabinet and outside of the electrical cabinet through the inner and outer vents.

The present disclosure has many advantages not present in the prior art. For example, the electrical cabinet wall or cover of the present disclosure prevents harmful arcing energy from exiting the cabinet, e.g. during a fault event. More specifically, the electrical cabinet wall of the present disclosure attenuates the arcing energy (e.g. by circulating hot gas through a baffle) such that low-level energy is provided at the cabinet exit. Thus, the electrical cabinet wall provides protection to personnel working outside of the cabinet. Further, the electrical cabinet wall of the present disclosure provides air-cooling to internal electrical components of the cabinet through ventilation while maintaining the required IP rating of the cabinet.

Referring now to the drawings, FIG. 1 illustrates one embodiment of a wind turbine 10 according to the present disclosure. As shown, the wind turbine 10 includes a tower 12 with a nacelle 14 mounted thereon. A plurality of rotor blades 16 are mounted to a rotor hub 18, which is in turn connected to a main flange that turns a main rotor shaft. The wind turbine power generation and control components (e.g. the components of FIG. 2) may be housed within the nacelle 14. The view of FIG. 1 is provided for illustrative purposes only to place the present invention in an exemplary field of use. It should be appreciated that the invention is not limited to any particular type of wind turbine configuration.

Figure 2:
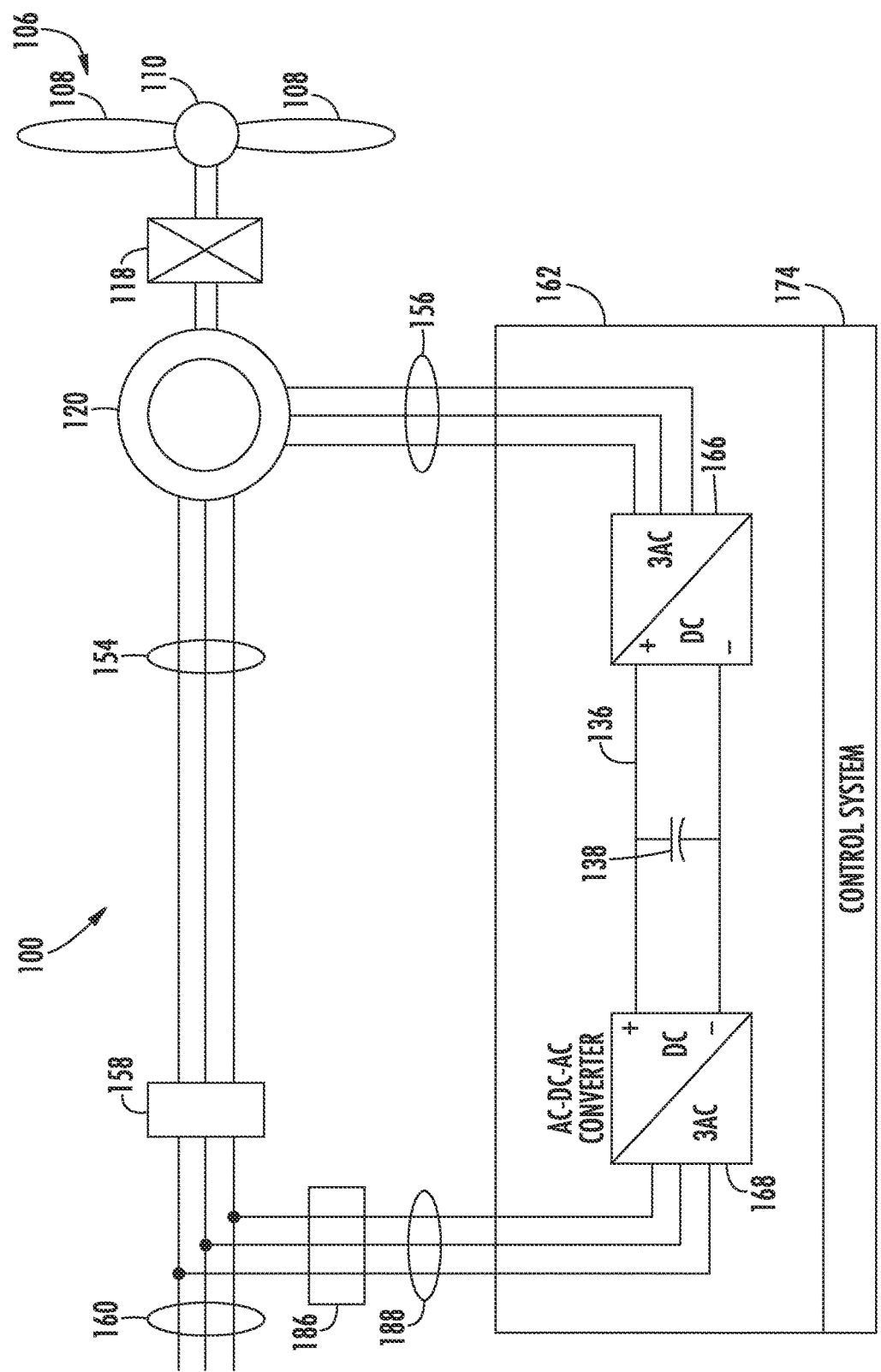
FIG. 2 illustrates a schematic view of one embodiment of a wind turbine power generation system according to the present disclosure.

Referring now to the drawings, FIG. 2 illustrates an example wind turbine power generation system 100 according to one embodiment of the present disclosure. Example aspects of the present disclosure are discussed with reference to the wind turbine 10 of FIG. 1 for purposes of illustration and discussion. Those of ordinary skill in the art, using the disclosures provided herein, should understand that example aspects of the present disclosure are also applicable in other power systems, such as a wind, solar, gas turbine, or other suitable power generation system.

In the example system 100, a rotor 106 includes a plurality of rotor blades 108 coupled to a rotatable hub 110, and together define a propeller. The propeller is coupled to an optional gear box 118, which is, in turn, coupled to a generator 120. In accordance with aspects of the present disclosure, the generator 120 may be any suitable generator, including, but not limited to a doubly fed induction generator (DFIG) or a fully fed induction generator. The generator 120 is typically coupled to a stator bus 154 and a power converter 162 via a rotor bus 156. The stator bus 154 provides an output multiphase power (e.g. three-phase power) from a stator of the generator 120 and the rotor bus 156 provides an output multiphase power (e.g. three-phase power) of a rotor of the generator 120.

Referring to the power converter 162, the DFIG 120 is coupled via the rotor bus 156 to a rotor-side converter 166. The rotor-side converter 166 is coupled to a line-side converter 168 which in turn is coupled to a line-side bus 188. In example configurations, the rotor-side converter 166 and the line-side converter 168 are configured for normal operating mode in a three-phase, pulse width modulation (PWM) arrangement using insulated gate bipolar transistor (IGBT) switching elements. The rotor-side converter 166 and the line-side converter 168 can be coupled via a DC link 136 across which is the DC link capacitor 138.

The power converter 162 can be coupled to a control system 174 to control the operation of the rotor-side converter 166 and the line-side converter 168 and other aspects of the power system 100.

In operation, alternating current power generated at the DFIG 120 by rotation of the rotor 106 is provided via a dual path to an electrical grid 160. The dual paths are defined by the stator bus 154 and the rotor bus 156. On the rotor bus side 156, sinusoidal multi-phase (e.g. three-phase) alternating current (AC) power is provided to the power converter 162. The rotor-side power converter 166 converts the AC power provided from the rotor bus 156 into direct current (DC) power and provides the DC power to the DC link 136. Switching elements (e.g. IGBTs) used in bridge circuits of the rotor side power converter 166 can be modulated to convert the AC power provided from the rotor bus 156 into DC power suitable for the DC link 136.

The line-side converter 168 converts the DC power on the DC link 136 into AC output power suitable for the electrical grid 160. In particular, switching elements (e.g. IGBTs) used in bridge circuits of the line-side power converter 168 can be modulated to convert the DC power on the DC link 136 into AC power on the line-side bus 188. The AC power from the power converter 162 can be combined with the power from the stator of the DFIG 120 to provide multi-phase power (e.g. three-phase power) having a frequency maintained substantially at the frequency of the electrical grid 160 (e.g. 50 Hz/60 Hz).

Various circuit breakers and switches, such as a converter breaker 186 and grid breaker 158, can be included in the system 100 to connect or disconnect corresponding buses, for example, when current flow is excessive and can damage components of the wind turbine system 100 or for other operational considerations. Additional protection components can also be included in the wind turbine system 100.

The power converter 162 can receive control signals from, for instance, the control system 174. The control signals can be based, among other things, on sensed conditions or operating characteristics of the wind turbine system 100. Typically, the control signals provide for control of the operation of the power converter 162. For example, feedback in the form of sensed speed of the DFIG 120 can be used to control the conversion of the output power from the rotor bus 156 to maintain a proper and balanced multi-phase (e.g. three-phase) power supply. Other feedback from other sensors can also be used by the control system 174 to control the power converter 162, including, for example, stator and rotor bus voltages and current feedbacks. Using the various forms of feedback information, switching control signals (e.g. gate timing commands for IGBTs), stator synchronizing control signals, and circuit breaker signals can be generated.

Various components of the wind turbine power generation system 100 of FIG. 2 are housed within a down-tower electrical assembly 130 of the wind turbine 10 (FIG. 1). More specifically, as shown in FIGS. 3-9, various views of the down-tower electrical assembly 130 of the wind turbine 10 having an improved electrical cabinet 132 according to the present disclosure are illustrated. As shown particularly in FIGS. 3 and 4, the electrical cabinet 132 has a plurality of walls 133 that define an internal volume 140. More specifically, as shown in the illustrated embodiment, the electrical cabinet 132 includes top and bottom walls, front and back walls, and right and left side walls. In addition, one or more of the walls 133 may be fixed (e.g. mounted in place) or hinged such that the cabinet 132 can be opened. For example, as shown, the front wall or cover 134 can be opened and/or removed. Thus, as shown, the internal volume 140 of the electrical cabinet 132 is configured to house one or more electrical components 122 as described herein. The electrical components 122 may include any suitable electrical components, for example, such as those described in FIG. 2. More specifically, in certain embodiments, the electrical components 122 as described herein may include any one or more of the following components: bus bars, cables, transformers, switches, transistors, resistors, converters, capacitors, contactors, breakers, inductors, or similar.

Figure 3:
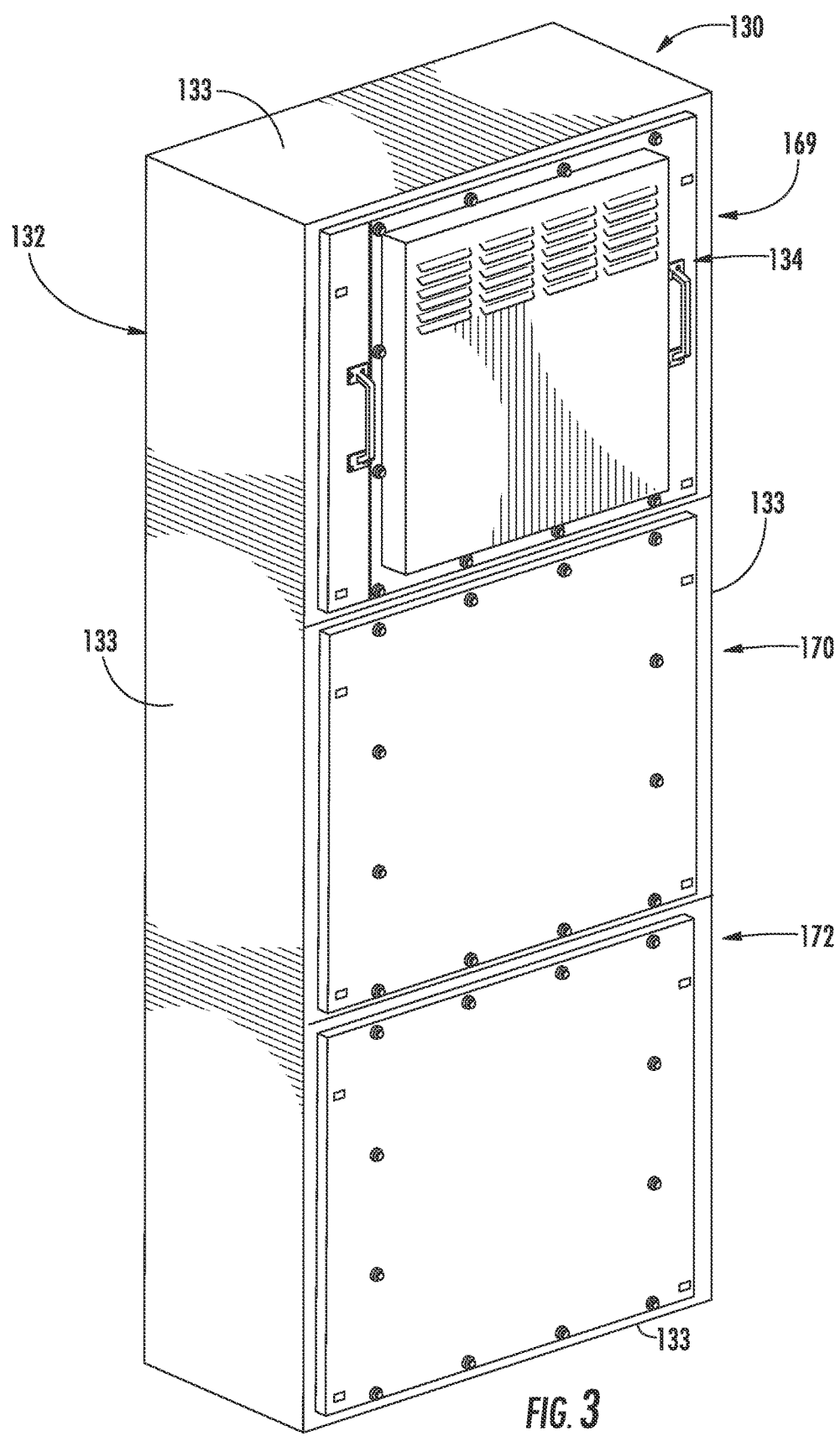
FIG. 3 illustrates a perspective view of one embodiment of an electrical assembly, e.g. a down-tower electrical assembly, for a wind turbine according to the present disclosure.
Figure 4:
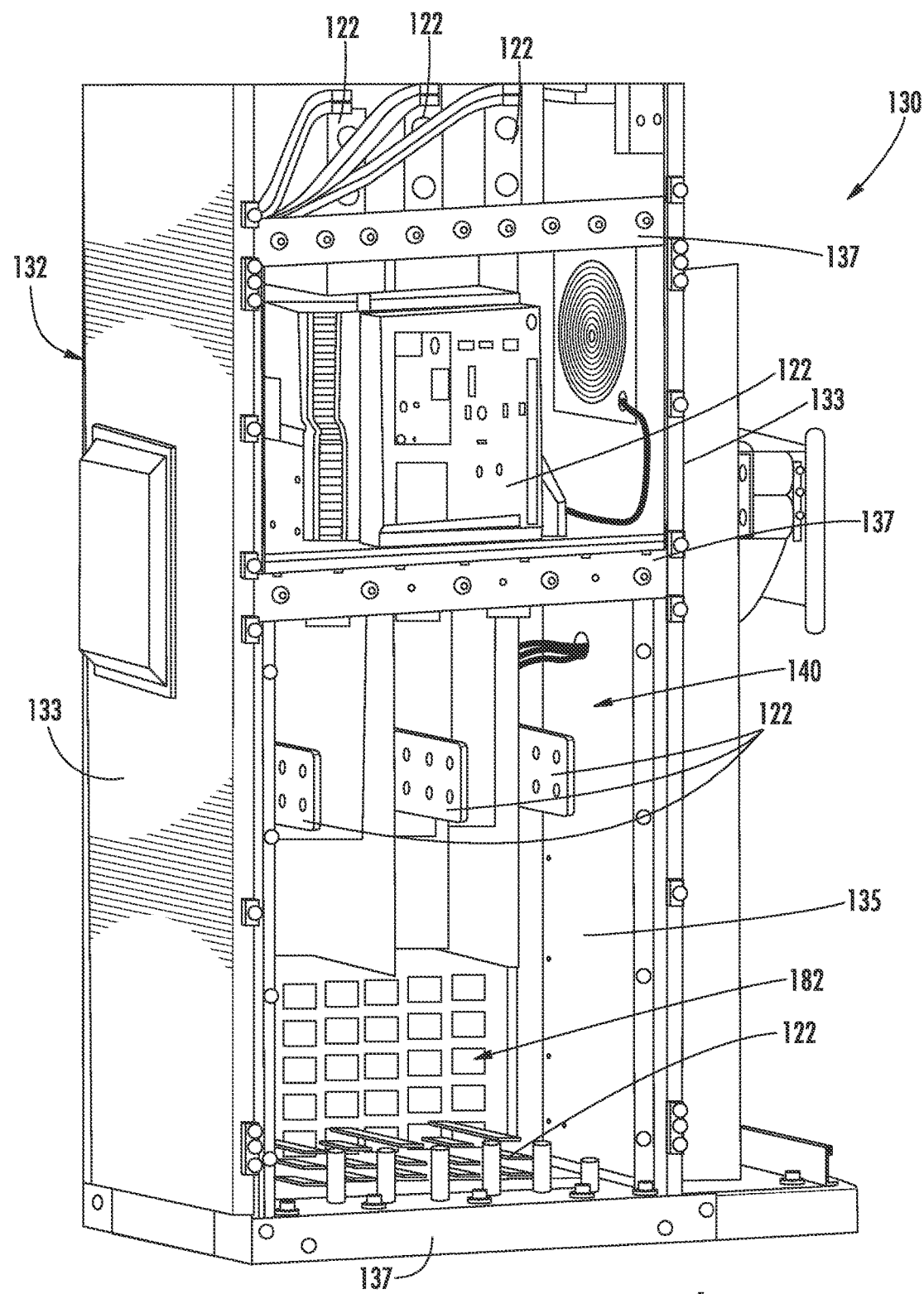
FIG. 4 illustrates a perspective view of one embodiment of an electrical assembly for a wind turbine according to the present disclosure, particularly illustrating the electrical assembly with the front cabinet cover or wall removed.

Further, as shown in FIGS. 3 and 4, the electrical cabinet 132 may include a plurality of sections, e.g. separated by one or more platforms 137, including but not limited to a grid cable entry section 172 (bottom section), a breaker section 170 (middle section), and a top section 169. In addition, as shown in FIG. 3, the electrical cabinet 132 may include a front opening 135.

Figure 5:
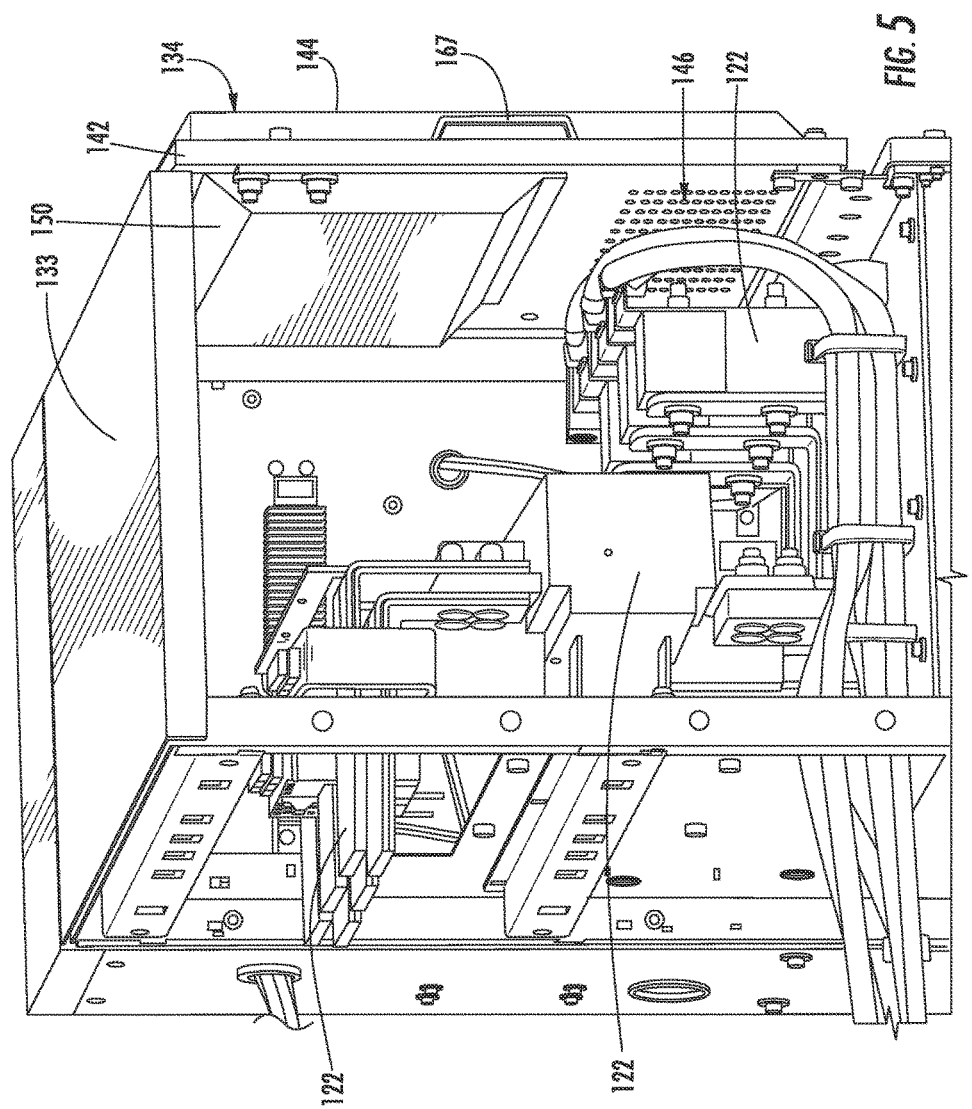
FIG. 5 illustrates a detailed, perspective view of one embodiment a top section of an electrical assembly according to the present disclosure, particularly illustrating a front electrical cabinet cover configured with the top section.

Referring particularly to FIGS. 4 and 5, one or more of the walls 133 of the electrical cabinet 132 may be configured to attenuate arc energy within the electrical cabinet 132. More specifically, as shown in FIGS. 3 and 5, the front cover 134 of the electrical cabinet 132 is configured to attenuate arc energy within the cabinet 132. Further, as shown in FIGS. 3-5, the front cover 134 is configured to cover at least a portion of the front opening 135 of the electrical cabinet 132, e.g. the top section opening. Further, as shown in FIGS. 5-9, the front cover 134 (or any of the remaining walls 133) may include an inner panel 142 and an outer panel 144 mounted to the inner panel 142. For example, as shown, the inner and outer panels 142, 144 may be constructed, at least in part, of a metal or metal alloy, the metal or metal alloy comprises at least one of copper, aluminum, steel, zinc, brass, iron, nickel, or combinations thereof. Thus, in certain embodiments, the inner and outer panels 142, 144 may be mounted to the electrical cabinet (or each other) using any suitable means, such as for example commonly known mechanical fasteners. As such, as shown in FIG. 5, the inner panel 142 is configured to cover at least a portion of the front opening 135 of the electrical cabinet 132 when mounted thereto.

Figure 6:
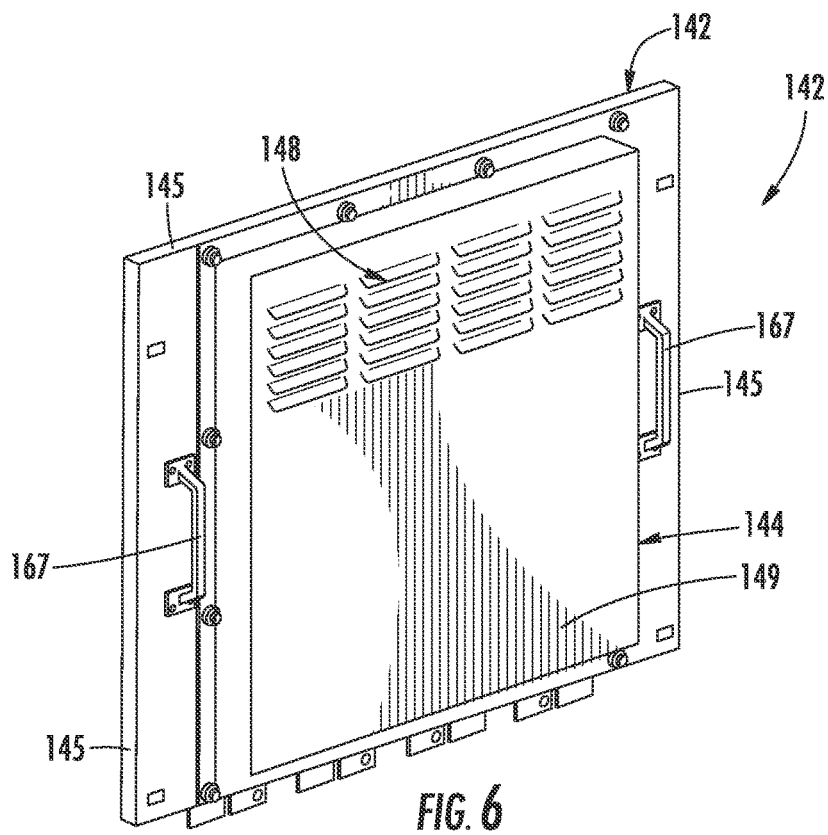
FIG. 6 illustrates a perspective view of one embodiment of an electrical cabinet wall for an electrical assembly of a wind turbine according to the present disclosure.
Figure 8:
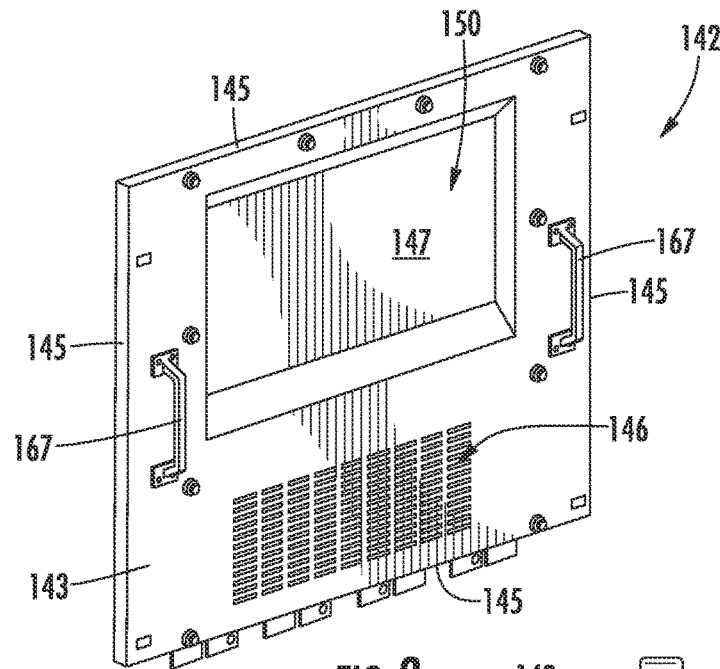
FIG. 8 illustrates a perspective view of one embodiment of an inner panel of an electrical cabinet wall for an electrical assembly of a wind turbine according to the present disclosure.
Figure 9:
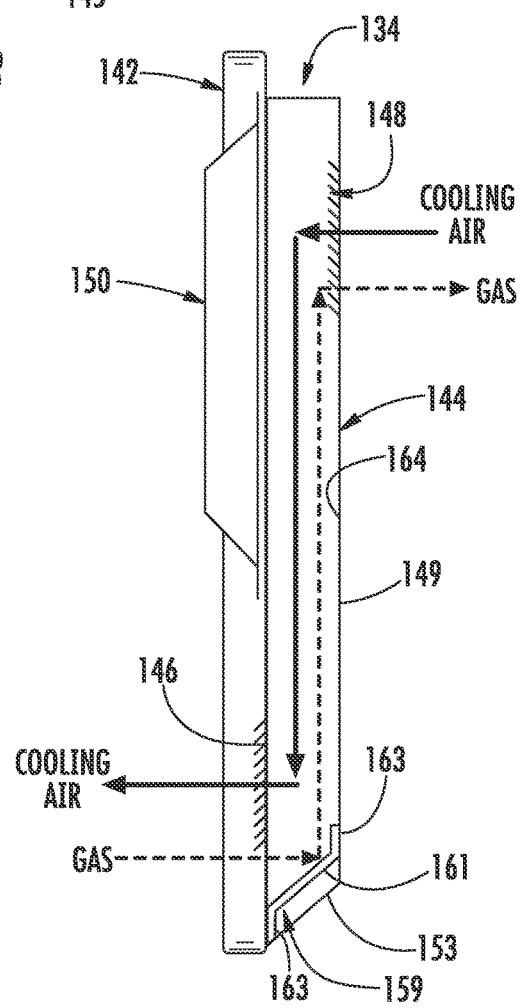
FIG. 9 illustrates a side view of one embodiment of an electrical cabinet wall for an electrical assembly of a wind turbine according to the present disclosure.

In addition, as shown in FIGS. 8 and 9, the inner panel 143 includes an inner vent 146. Similarly, as shown in FIGS. 6 and 9, the outer panel 144 includes an outer vent 148. Thus, air and/or gas can be easily directed between the internal volume 140 of the electrical cabinet 132 and outside of the electrical cabinet 132 through the inner and outer vents 146, 148. More specifically, as shown particularly in FIG. 8, the inner panel 142 may include a base wall 143 and a plurality of side walls 145 extending perpendicularly therefrom. Thus, in such embodiments, the inner vent 146 may be configured in the base wall 143. In another embodiment, as shown in FIG. 9, the inner vent 146 and the outer vent 148 may be offset, e.g. one vent may be above, below, or beside the other vent, so as to provide an elongated flow paths 131, 141 for the air and/or gas (FIG. 9). Thus, as shown, the inner vent 146 may be configured to align with one or more of the electrical components 122 within the internal volume 140 of the electrical cabinet 132, e.g. in the top section 169 of the electrical cabinet 132, so as to provide airflow to the one or more electrical components 122 contained therein. More specifically, as shown, the outer vent 148 may be configured above the inner vent 146.

Referring particularly to FIG. 8, the base wall 143 of the inner panel 142 may further include an opening 147 configured above the inner vent 146. In such embodiments, as shown in FIGS. 5, 8, and 9, the front cover 134 may further include a gas expansion cover 150 mounted to the base wall 143 of the inner panel 142 adjacent to the opening 147 of the inner panel 142. Thus, the gas expansion cover 150 provides a location for expanding gas when hot gas is directed through the front cover 134, which will be described in more detail below.

Figure 7:
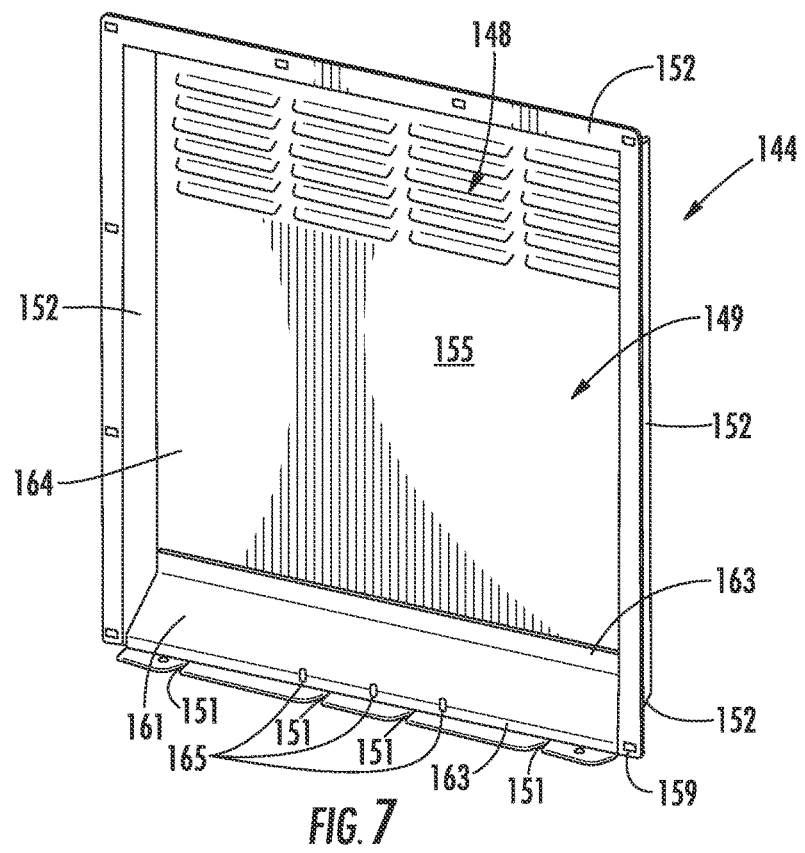
FIG. 7 illustrates a perspective view of one embodiment of an outer panel of an electrical cabinet wall for an electrical assembly of a wind turbine according to the present disclosure.

Referring particularly to FIGS. 6, 7, and 9, the outer panel 144 may include an outer wall 149 and a plurality of side walls 152 extending therefrom so as to define an inner cavity 155. More specifically, as shown, the plurality of side walls 152 may include a top side wall, a bottom side wall, and opposing side walls. In certain embodiments, the bottom side wall may include a sloped bottom wall 157. In addition, the sloped bottom wall 157 may include one or more drainage holes 151. Thus, in particular embodiments, the front cover 134 may also include an inner gas shield 159 mounted to a lower portion of the outer wall 149 of the outer panel 144 below the outer vent 148. More specifically, as shown in FIG. 9, the inner gas shield 159 may include a sloped body portion 161 and one or more flanges 163. Thus, as shown, at least one flange 163 may be mounted to the outer wall 146 of the outer panel 144 and an opposing flange 163 may be mounted to the sloped bottom wall 153 of the outer panel 144 or the inner panel 142. As such, when mounted, the sloped body portion 161 of the inner gas shield 159 may extend from an inner surface 164 of the outer wall 149 to the sloped bottom wall 153 of the outer panel 144. In further embodiments, as shown in FIG. 7, the inner gas shield 159 may include one or more drainage holes 165 configured to allow liquid entering the outer vent 148 to pass therethrough. More specifically, as shown in FIG. 7, the drainage holes 165 of the inner gas shield 159 may be offset from the drainage holes 151 on the outer panel 144. As such, the inner gas shield 159 is configured to allow cooling air or hot gas to flow through the inner and outer panels 142, 144 of the front cover 134 while preventing water (e.g. that enters the outer vent 148) from entering the cabinet 132, e.g. by draining the water through the drainage holes 165. Further, as shown in FIG. 9, the sloped bottom side wall 153 is configured to prevent gas from leaking out at the outer panel 144 wherein personnel may be located. More specifically, as shown, the holes 151 of the outer panel 144 and the holes 165 of the inner gas shield 159 may be offset such that gas will not have a direct path out of the internal volume so as to mitigate gas leakage caused by a fault event.

During operation, as shown in FIG. 9, the front cover 134 allows cooling air to enter the electrical cabinet 132 through the outer vent 148, e.g. during normal operation. The cooling air (as indicated by the solid arrows) is then directed down towards the inner vent 146 of the front cover 134 such that the cooling air is provided at a desired location for cooling, e.g. near one or more of the electrical component(s) 122 within the internal volume 140. In the event of high energy arc-flashing in the electrical cabinet 132 (e.g. during a fault event), the front cover 134 is configured to direct hot gas (as indicated by the dotted arrows) through the inner vent 146 and up to the outer vent 148. As such, as gas reaches a location outside of the electrical cabinet 132, the gas has been cooled and is no longer a danger to personnel working outside of the cabinet 132.

In additional embodiments, as shown in FIGS. 5, 6, and 8, the front cover 134 may also include one or more handles 167 configured to assist a user with removing and/or installing the front cover 134 to and from the electrical cabinet 132. In addition, the handles 167 may provide an additional safety feature within the tower 12 of the wind turbine 10, e.g. to provide a handle in the event personnel trips and falls within the tower 12.

Figure 10:
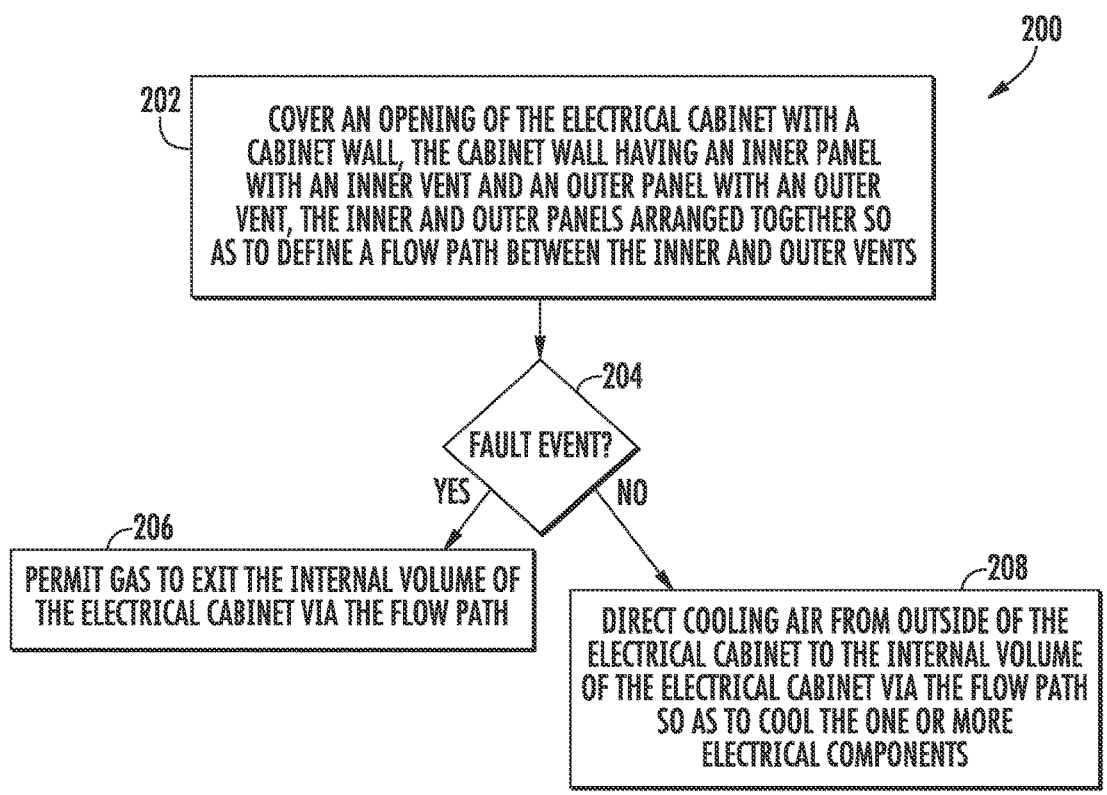
FIG. 10 illustrates a flow diagram of one embodiment of a method for mitigating arc energy in an electrical assembly of a wind turbine according to the present disclosure.

Referring now to FIG. 10, a flow diagram of one embodiment of a method 200 for mitigating arc energy in the electrical assembly 130 of the wind turbine 10 according to the present disclosure is illustrated. As shown at 202, the method 200 includes covering an opening of the electrical cabinet 132 with at least one of the cabinet wall 134 as described herein. As shown at 204, the cabinet wall 134 is configured to mitigate arc energy within the electrical cabinet 132 based on whether a fault event is occurring in the cabinet 132. Thus, as shown at 206, during a fault event, the method 200 includes permitting gas to exit the internal volume 140 of the electrical cabinet 132 via the flow path 141 (FIG. 9). As shown at 208, during normal operation, the method 200 includes directing cooling air from outside of the electrical cabinet 132 to the internal volume 140 of the electrical cabinet 132 via the flow path 131 so as to cool the one or more electrical component(s) 122 (FIG. 9).

Figure 11:
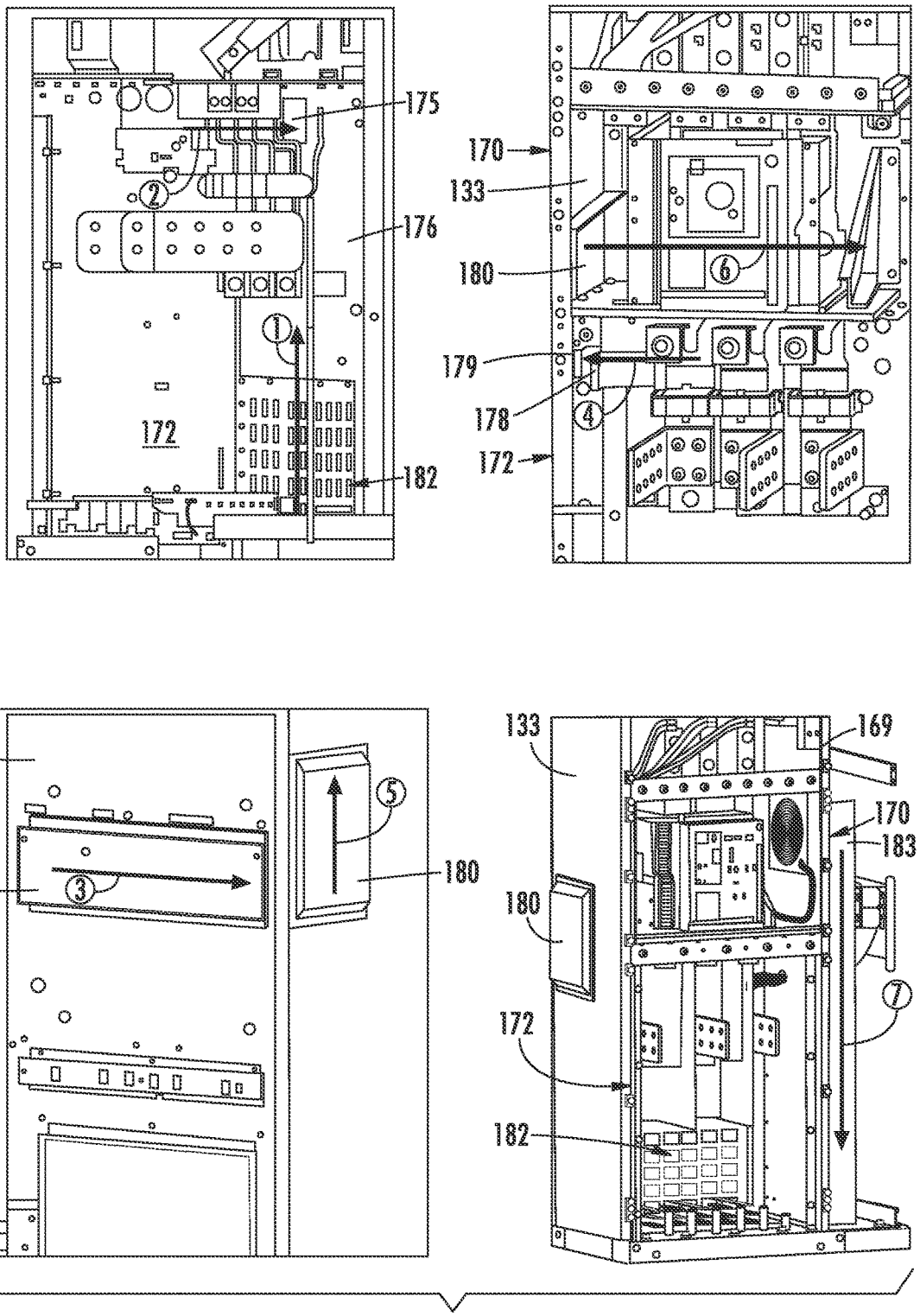
FIG. 11 illustrates a schematic view of one embodiment of a process for mitigating arc energy in an electrical assembly of a wind turbine according to the present disclosure.
Figure 12:
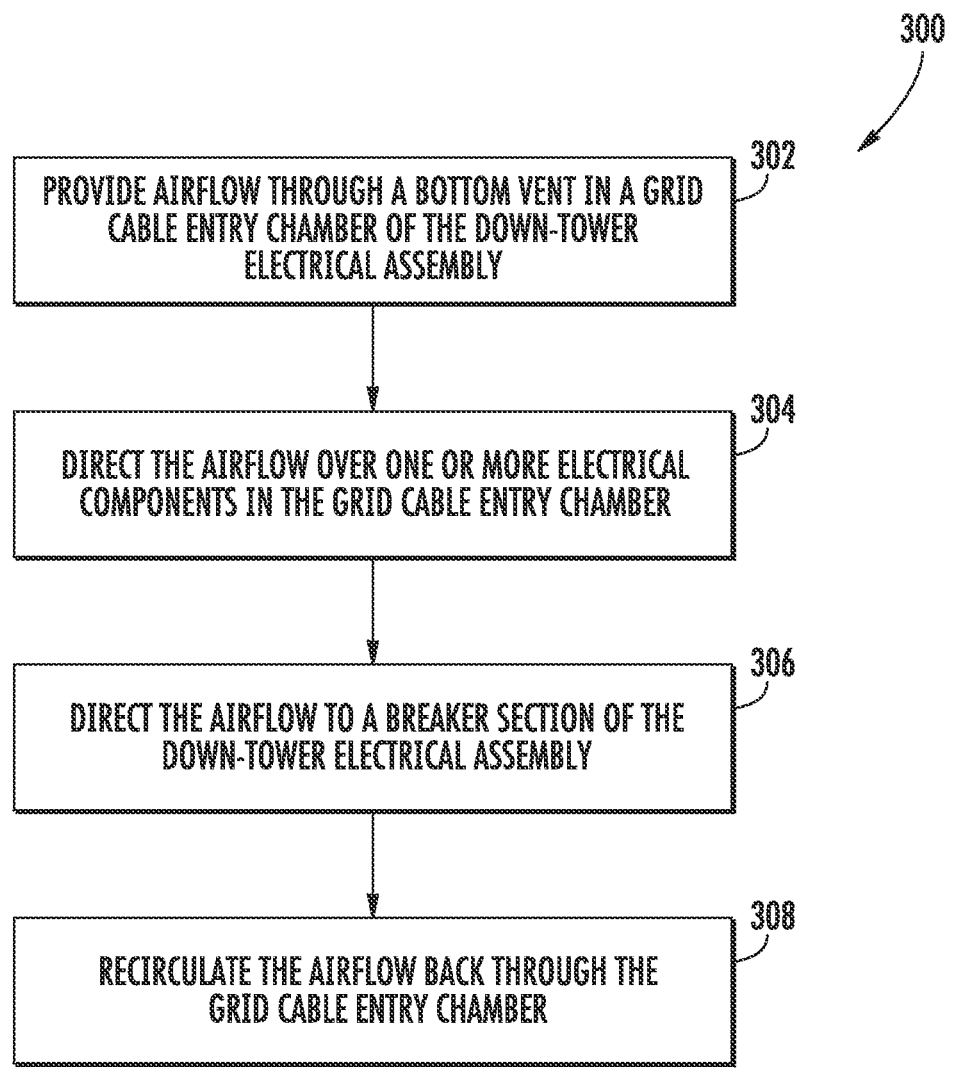
FIG. 12 illustrates a flow diagram of another embodiment of a method for mitigating arc energy in an electrical assembly of a wind turbine according to the present disclosure.

Referring now to FIGS. 11 and 12, various figures illustrating a process for further mitigating arc energy in an electrical assembly 130 of a wind turbine 10 are illustrated. More specifically, as shown in FIG. 11, a schematic view of one embodiment of a process for mitigating arc energy in the electrical assembly 130 of the wind turbine 10 according to the present disclosure is illustrated. Similarly, as shown in FIG. 12, a flow diagram of one embodiment of a method 300 for mitigating arc energy in the electrical assembly 130 of the wind turbine 10 according to the present disclosure is illustrated. Thus, it should be understood that the method 300 may be utilized alone or in combination with the improved cabinet wall(s) 134 as described herein. As shown at 302, the method includes providing cooling air through a bottom vent 182 in a grid cable entry section 172 of the electrical cabinet 132, e.g. as indicated by arrow (1). As shown at 304, the method 300 includes directing the cooling air over one or more electrical components 122 in the grid cable entry section 172. As shown at 306, the method 300 includes directing the cooling air to a breaker section 170 of the electrical cabinet 132. As shown at 308, the method 300 also includes recirculating the cooling air back through the grid cable entry section and out through the bottom vent 182.

More specifically, as shown in FIG. 11, the step of directing the cooling air to the breaker section 170 of the electrical cabinet 132 may include directing the cooling air through an opening 175 in a back panel 176 of the electrical cabinet 132, e.g. as indicated by arrow (2). Further, as indicated by arrow (3), the cooling air may be further directed into a first conduit 177. As indicated by arrow (4), the cooling air may then pass through another channel 178 that connects the back panel 176 with an opening 179 on a side panel 133 of the cabinet 132. As indicated by arrow (5), the cooling air may then be circulated through a second conduit 180 that connects the grid cable entry section 172 to the breaker section 170.

In certain embodiments, the step of recirculating the airflow back to the bottom vent 182 may further include recirculating the airflow through a third conduit 183 adjacent to the grid cable entry section 172 and down to the bottom vent 182. In another embodiment, as shown in FIG. 1, the electrical cabinet 132 may be configured above a tower platform 20 in the tower 12 of the wind turbine 10. Thus, in such embodiments, the method 200 may also include recirculating the cooling air through the bottom vent 182 to an area 184 below the tower platform 20.

In further embodiments, the method 200 may also include providing an improved electrical cabinet wall or cover, e.g. such as the front cover 134 as described herein, for the electrical cabinet 132. Thus, in certain embodiments, the method 200 may include circulating airflow between inside of the electrical cabinet 132 and outside of the electrical cabinet 132 through inner and outer vents 146, 148 of the front cover 134. In additional embodiments, the method 200 may include providing cooling air through the outer vent 148 down to the inner vent 146 and through the electrical cabinet 132. Alternatively, during a fault event, the method 200 may include circulating gas through the inner vent 146 up to the outer vent 146 and out of the electrical cabinet 132.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A cabinet wall for an electrical cabinet of an electrical assembly for a wind turbine, the electrical cabinet defining an internal volume, the internal volume housing one or more electrical components therein, the cabinet wall comprising:
   an inner panel configured to cover at least a portion of an opening of the electrical cabinet, the inner panel comprising an inner vent; and,
   an outer panel mounted to the inner panel, the outer panel comprising an outer vent and an outer wall with a plurality of side walls extending therefrom so as to define an inner cavity, the plurality of side walls comprising a top side wall, a sloped bottom side wall, and opposing side walls, the inner and outer panels arranged together so as to define a flow path between the inner and outer vents,
   wherein, during normal operation, air is directed from outside of the electrical cabinet to the internal volume of the electrical cabinet via the flow path so as to cool the one or more electrical components, and
   wherein, during a fault event, gas is permitted to exit the internal volume of the electrical cabinet via the flow path.

2. The cabinet wall of claim 1, wherein the cabinet wall comprises at least one of a top wall, a bottom wall, a front cover, a back wall, or opposing walls.

3. The cabinet wall of claim 1, wherein the inner panel further comprises a base wall and a plurality of side walls extending perpendicularly therefrom, the inner vent configured in the base wall.

4. The cabinet wall of claim 3, wherein the base wall of the inner panel further comprises an opening configured above the inner vent, the cabinet wall further comprising a gas expansion cover mounted to the base wall adjacent to the opening of the inner panel.

5. The cabinet wall of claim 1, further comprising an inner gas shield mounted to a lower portion of the outer wall below the outer vent.

6. The cabinet wall of claim 5, wherein the inner gas shield comprises a sloped body portion and one or more flanges, at least one flange being mounted to the outer wall and an opposing flange being mounted to the sloped bottom side wall, the sloped body portion extending from an inner surface of the outer wall to the sloped bottom side wall.

7. The cabinet wall of claim 5, wherein the inner gas shield further comprises one or more drainage holes configured to allow liquid entering the outer vent to pass therethrough.

8. The cabinet wall of claim 1, wherein the inner vent and the outer vent are offset so as to create an elongated flow path for the air or gas.

9. The cabinet wall of claim 8, wherein the inner vent aligns with one or more electrical components configured within the internal volume so as to provide airflow to the one or more electrical components.

10. The cabinet wall of claim 1, further comprising one or more handles configured to assist a user with removing or installing the cabinet wall to and from the electrical cabinet.

11. An electrical assembly for a wind turbine, comprising:
   an electrical cabinet comprising a plurality of cabinet walls defining an internal volume, the electrical cabinet comprising at least one opening; and,
   one or more electrical components configured within the internal volume,
   wherein at least one of the cabinet walls are configured to cover at least a portion of the opening of the electrical cabinet, at least one of the cabinet walls comprising an inner panel and an outer panel mounted to the inner panel, the inner panel comprising an inner vent, the outer panel comprising an outer vent and an outer wall with a plurality of side walls extending therefrom so as to define an inner cavity, the plurality of side walls comprising a top side wall, a sloped bottom side wall, and opposing side walls, the inner and outer panels arranged together so as to define a flow path between the inner and outer vents,
   wherein, during normal operation, air is directed from outside of the electrical cabinet to the internal volume of the electrical cabinet via the flow path so as to cool the one or more electrical components, and
   wherein, during a fault event, gas is permitted to exit the internal volume of the electrical cabinet via the flow path.

12. The method of claim 11, wherein the one or more electrical components comprise one or more of the following components: bus bars, cables, transformers, switches, transistors, resistors, converters, capacitors, contactors, breakers, or inductors.

13. A method for mitigating arc energy in an electrical assembly of a wind turbine, the electrical assembly having an electrical cabinet defining an internal volume with one or more electrical components contained therein, the method comprising:
   covering an opening of the electrical cabinet with a cabinet wall, the cabinet wall having an inner panel with an inner vent and outer panel with an outer vent, the inner and outer panels arranged together so as to define a flow path between the inner and outer vents, the outer panel having an outer wall with a plurality of side walls extending therefrom so as to define an inner cavity, the plurality of side walls comprising a top side wall, a sloped bottom side wall, and opposing side walls;
   during a fault event, permitting gas to exit the internal volume of the electrical cabinet via the flow path; and
   during normal operation, directing cooling air from outside of the electrical cabinet to the internal volume of the electrical cabinet via the flow path so as to cool the one or more electrical components.

14. The method of claim 13, further comprising:
   providing cooling air through a bottom vent in a grid cable entry section of the electrical cabinet;
   directing the cooling air over one or more electrical components within the grid cable entry section;
   directing the cooling air to a breaker section of the electrical cabinet; and,
   recirculating the cooling air back through the bottom vent.

15. The method of claim 14, wherein directing the cooling air to the breaker section of the electrical cabinet further comprises:
   directing the cooling air through a first conduit configured with a back side of a back panel of the grid cable entry section, and
   directing the cooling air from the first conduit through a second conduit that connects the grid cable entry section to the breaker section.

16. The method of claim 14, wherein the step of recirculating the cooling air back to the bottom vent further comprises recirculating the cooling air through a third conduit adjacent to the grid cable entry section and down to the bottom vent, wherein the electrical cabinet is configured above a tower platform in a tower of the wind turbine, the method further comprising recirculating the cooling air through the bottom vent to an area below the tower platform.

17. The method of claim 16, further comprising circulating air or gas between inside of the electrical cabinet and outside of the electrical cabinet through the inner and outer vents.

18. The method of claim 17, wherein the outer vent is above the inner vent, the method further comprising at least one of providing cooling air through the outer vent down to the inner vent and through the electrical cabinet or circulating gas from the internal volume of the electrical cabinet through the inner vent up and out through the outer vent outside of the electrical cabinet.

* * * * *